United States Patent
Parris et al.

(10) Patent No.: US 7,631,233 B2
(45) Date of Patent: Dec. 8, 2009

(54) DATA INVERSION REGISTER TECHNIQUE FOR INTEGRATED CIRCUIT MEMORY TESTING

(75) Inventors: Michael C. Parris, Colorado Springs, CO (US); Oscar Frederick Jones, Jr., Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 232 days.

(21) Appl. No.: 11/868,509

(22) Filed: Oct. 7, 2007

(65) Prior Publication Data
US 2009/0094497 A1    Apr. 9, 2009

(51) Int. Cl.
*G11C 29/00* (2006.01)
*H04L 1/00* (2006.01)
(52) U.S. Cl. ............................ 714/720; 714/823
(58) Field of Classification Search ............... None
See application file for complete search history.

(56) References Cited

U.S. PATENT DOCUMENTS

| | | | | |
|---|---|---|---|---|
| 5,940,874 A | * | 8/1999 | Fulcomer | 711/217 |
| 6,769,081 B1 | * | 7/2004 | Parulkar | 714/733 |
| 6,918,075 B2 | * | 7/2005 | Matsui | 714/738 |
| 7,302,622 B2 | * | 11/2007 | Beer | 714/718 |

* cited by examiner

*Primary Examiner*—Christine T Tu
(74) *Attorney, Agent, or Firm*—William J. Kubida; Peter J. Meza; Hogan & Hartson LLP

(57) ABSTRACT

A data inversion register technique for integrated circuit memory testing in which data input signals are selectively inverted in a predetermined pattern to maximize the probability of identifying failures during testing. In accordance with the technique of the present invention, on predetermined input/outputs (I/Os,) data inputs may be inverted to create a desired test pattern (such as data stripes) which are "worst case" for I/O circuitry or column stripes which are "worst case" for memory arrays. A circuit in accordance with the technique of the present invention then matches the pattern for the data out path, inverting the appropriate data outputs to obtain the expected tester data. In this way, the test mode is transparent to any memory tester.

15 Claims, 6 Drawing Sheets

400B

DATA INVERSION REGISTER TECHNIQUE FOR INTEGRATED CIRCUIT MEMORY TESTING

BACKGROUND OF THE INVENTION

The present invention relates, in general, to the field of integrated circuit memory devices and those devices incorporating embedded memory. More particularly, the present invention relates to a data inversion register technique for integrated circuit memory testing which results in a maximization of the probability of identifying device failures during testing.

With today's standard dynamic random access memory (DRAM) devices, input/output (I/O) widths are becoming ever larger with 32 bit widths and wider being relatively common. In comparison, embedded DRAM circuits may contain even wider I/O widths including those having 256 data in (Din) and 256 data out (Dout) widths and wider.

Manufacturing testing of these wide I/O DRAM circuits is particularly challenging. Data compression test modes have been used to meet this challenge but these techniques lack the pattern capability needed to exercise the full memory array and data path. Further, conventional data path circuits do not have the capability for writing data stripes from a single data input signal.

SUMMARY OF THE INVENTION

The data inversion register technique of the present invention is, therefore, operative to invert data input signals in a predetermined pattern to maximize the probability of identifying failures and defects during testing of memory arrays.

On predetermined I/Os, the technique of the present invention is operative to invert data inputs to create a desired test pattern which is, for example, the "worst case" for I/O circuitry such as data stripes. In addition, the technique of the present invention may also invert data inputs to produce a test pattern which is the "worst case" for memory arrays, such as column stripes. A circuit in accordance with the technique of the present invention then matches the pattern for the data out path, inverting the appropriate data outputs to obtain expected tester data. In this way, the test mode is transparent to any memory tester.

While in the test mode, the invert data (ID) control input can be "high" or "low", allowing the inversion to take place on these selected data lines or not. The selected data lines for inversion can be hard wired so that "even" or "odd" data gets inverted or in accordance with another pattern such as 1-of-8 data bits being inverted or controlled by a register. With register control, the bits that are inverted can change as desired by the user.

The technique of the present invention therefore allows for a reduced number of data inputs (all the way down to and including one) to be supplied to the DRAM. For example, for ease of testing, one data bit can be supplied to all of the DRAM chip or macro block data inputs. In accordance with the present invention, a more interesting data pattern can be applied to the actual memory array than simply all "ones" or "zeroes".

The data outputs may also be multiplexed, or compressed down, to a reduced number, all the way down to and including a single output if desired. In accordance with one embodiment of the present invention disclosed herein, the output data path is simply matched to the data in path with an ID controlled inverter. Another embodiment of the present invention contemplates multiplexing the data down to a more narrow output width for testing ease and control which data bits get inverted with the actual multiplexed addresses. This serves to reduce the number of data inverters needed on the output path.

Particularly disclosed herein is a testing technique for an integrated circuit device including a memory array. The technique comprises determining a pattern of data inputs to be applied to the memory array, inverting selected ones of the pattern of data inputs, applying the pattern of data inputs including the inverted selected ones to the memory array, reading out the contents of the memory array, further inverting the previously inverted selected ones of the applied pattern from the read out contents and comparing the applied pattern of data inputs with the read out contents.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
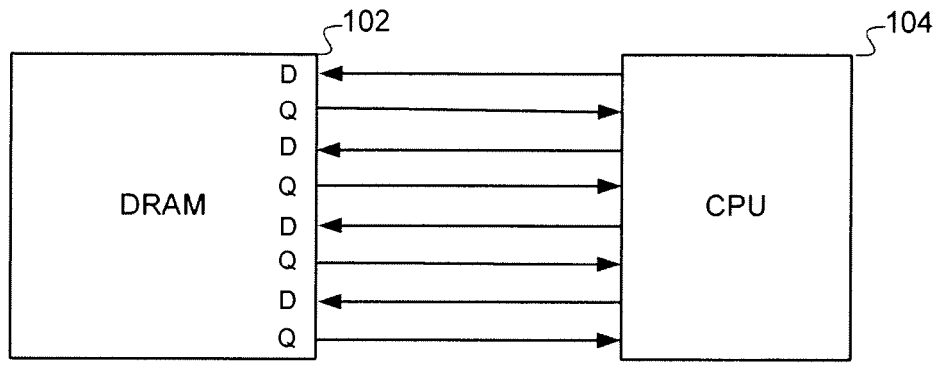
FIG. 1 is a simplified functional block diagram illustrative of a prior art interconnection of a DRAM with a central processing unit (CPU)

With reference now to FIG. 1, a simplified functional block diagram illustrative of a prior art circuit 100 interconnection of a DRAM 102 with a central processing unit (CPU) 104 by means of a number of data input (D) and data output (Q) lines is shown.

Figure 2:
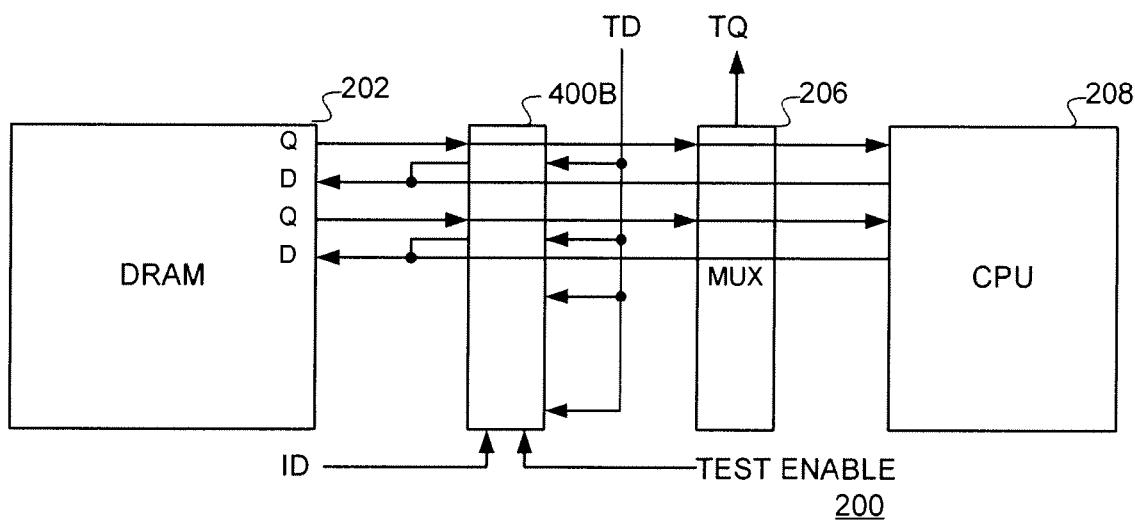
FIG. 2 is a corresponding simplified functional block diagram of a representative testing configuration for implementing the data inversion register technique of the present invention.

With reference additionally now to FIG. 2, a corresponding simplified functional block diagram of a representative testing configuration 200 is shown for implementing the data inversion register technique of the present invention. In this illustration, a number of test mode input drivers 400B and a multiplexer 206 are coupled between a DRAM 202 and a CPU 208. The test mode input drivers 400B receive an invert data (ID) signal and TEST ENABLE signal in addition to input test data (TD). As shown, the multiplexer 206 ultimately outputs the test data (TQ).

Figure 3B:
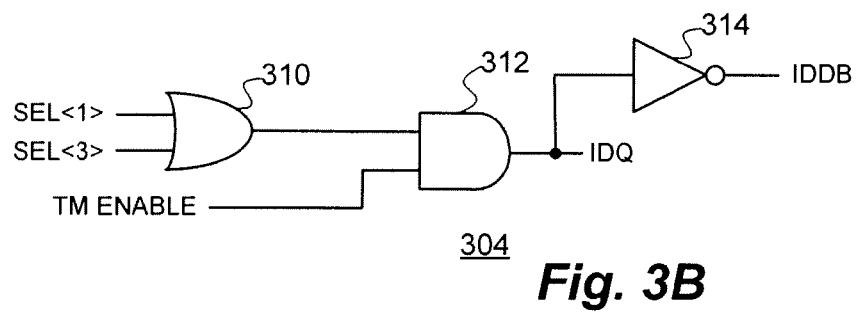
FIG. 3B is a simplified gate level illustration of a possible implementation of the decoder of the preceding figure.
Figure 3A:
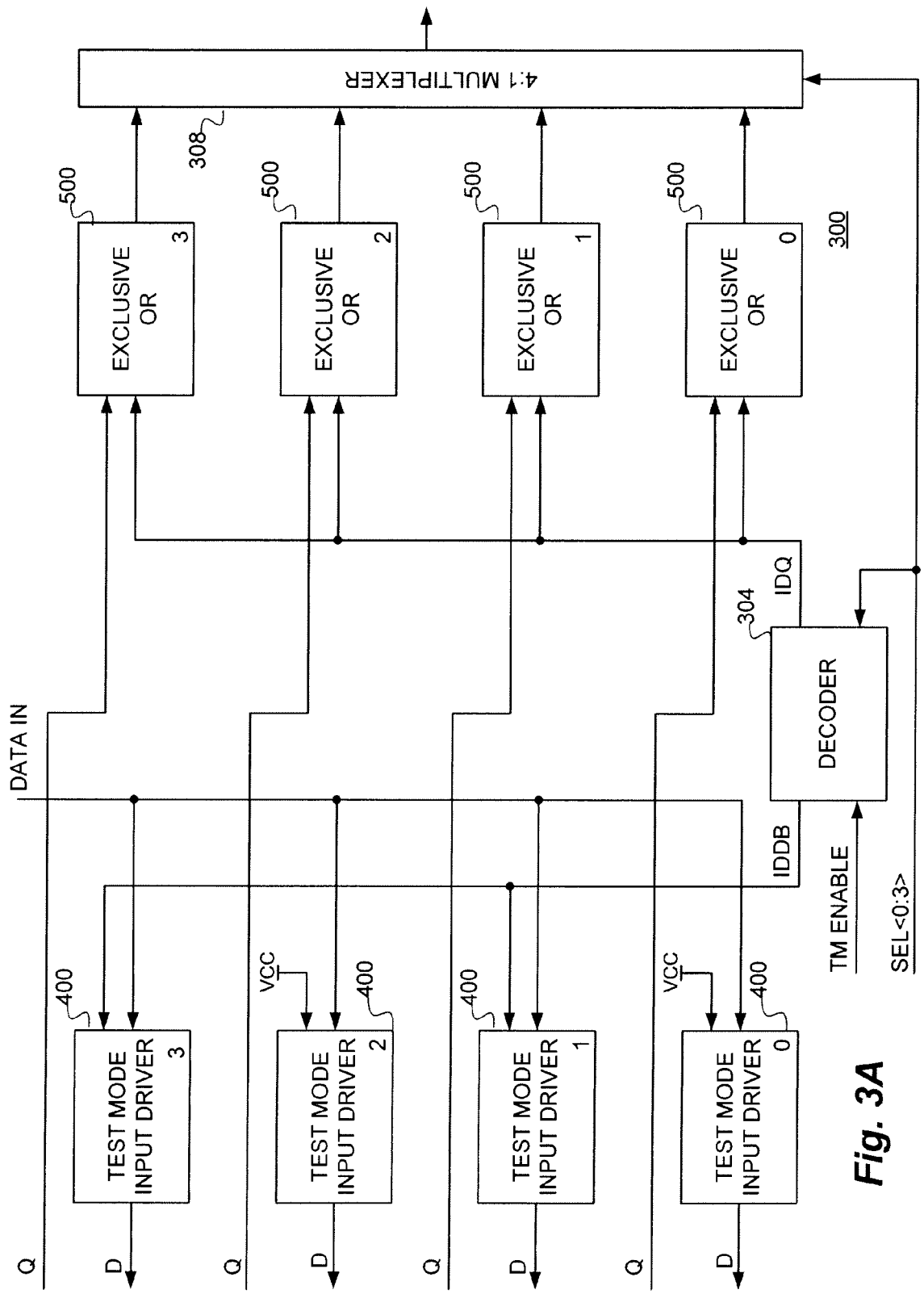
FIG. 3A is another simplified functional block diagram of a further representative testing configuration for implementing the technique of the present invention.

With reference additionally now to FIG. 3A, another simplified functional block diagram of a further representative testing configuration 300 is shown for implementing the technique of the present invention. In this particular figure, the associated DRAM and CPU are not illustrated.

As shown, a number of test mode input drivers 400 (e.g. drivers 0 through 3) are illustrated, each coupled to received data input on a common connected DATA IN line as shown. Even numbered ones of the test mode input drivers 400 have an input coupled to a supply voltage source while odd numbered ones receive an IDDB signal from a decoder 304 which will be illustrated in more detail hereinafter. The test mode input drivers 400 supply the data input (D) to the DRAM (not shown).

Data output (Q) from the DRAM is supplied as one input to a number of Exclusive OR (EXOR) circuits 500 (e.g. circuits 0 through 3) which also receive an IDQ signal output from the decoder 304. Decoder 304 receives a number of SEL bit inputs in order to select which EXOR 500, and which input drivers 400, will be operated on during the invention test mode. These select bits, four required in this representative example, are the same select bits that are used for the final data multiplexer. As shown, the outputs of the EXOR circuits 500 are provided as inputs to a 4:1 multiplexer 308 for selectively supplying the test data output (Q). The 4:1 multiplexer 308 will be illustrated and described in more detail hereinafter.

These select bits can be chosen for the given application. For example, bits 0 and 2 could be used to invert on even data lines instead of odd data lines or all four select bits could be used together to invert on all four data lines. These select bits can come from a test mode register so that the select data inversion bits can change.

With reference additionally now to FIG. 3B, a simplified gate level illustration of a possible implementation of the decoder 304 of the preceding figure is shown. The decoder 304 receives select signals SEL<1> and SEL<3> for the odd numbered EXOR circuits 500 as inputs to an OR gate 310 which has its output coupled to one input of a two-input AND gate 312. The other input to the AND gate 312 is a TEST MODE (TM) ENABLE signal. Output of the AND gate 312 is the IDQ signal which is supplied to the EXOR circuits 500. IDQ is coupled to inverter 314 which generates a second output IDDB which is supplied to input drivers 400 and 400B.

Figure 4A:
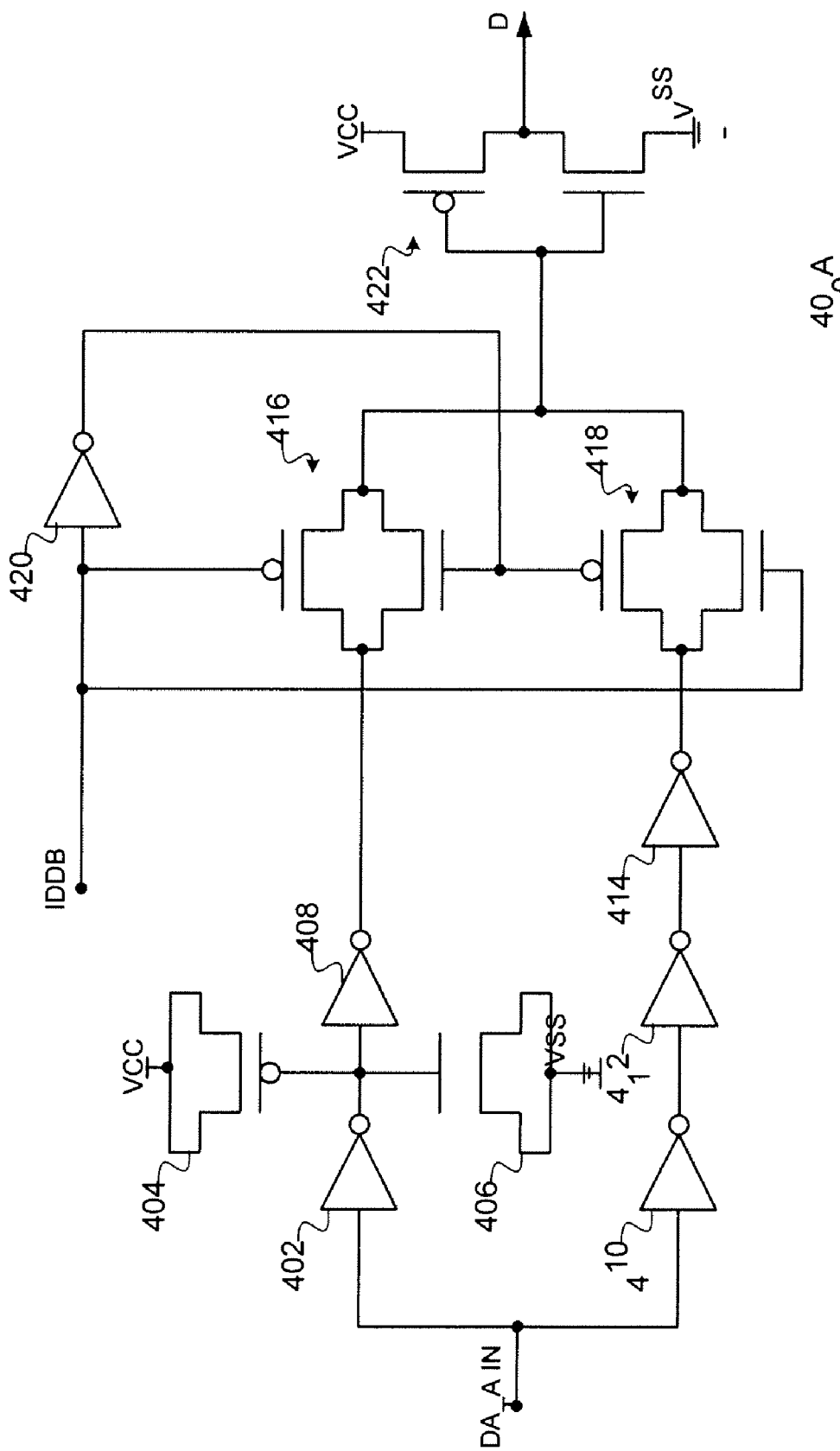
FIG. 4A is a detailed schematic illustration of a particular implementation of a test data input driver for possible use in conjunction with the representative testing configuration of FIG. 3A.

With reference additionally now to FIG. 4A, a detailed schematic illustration of a particular implementation of a test data input driver 400A is shown for possible use in conjunction with the representative testing configuration 300 of FIG. 3A. The test data input driver 400A receives data input at node DATA IN which is coupled through an inverter 402 to another intermediate node having a capacitor coupled P-channel transistor 404 tied to a supply voltage source (VCC) and a corresponding capacitor coupled N-channel transistor 406 tied to a reference voltage source (VSS or circuit ground). This intermediate node is coupled through another inverter 408 to one input of a CMOS transmission gate 416.

Similarly, the data input on node DATA IN is coupled through another string of series connected inverters 410, 412 and 414 to the input of a second CMOS transmission gate 418. The IDDB signal from the decoder 304 (FIG. 3B) is supplied directly to the gate of the P-channel transistor of the transmission gate 416 as well as the gate of the N-channel transistor of the transmission gate 418. The IDDB signal is also inverted through an inverter 420 for application to the gate terminals of the N-channel transistor of transmission gate 416 and the P-channel transistor of transmission gate 418. The outputs of both transmission gates 416 and 418 are provided as input to a CMOS inverter 422 to supply the data input (D) to the DRAM (not shown).

In operation, the test data input driver 400A performs a data inversion function in the data path when the IDDB input is at a logic "low" level. When the IDDB input is at a logic "high" level, the test data input driver 400A outputs non-inverted data (D).

Figure 4B:
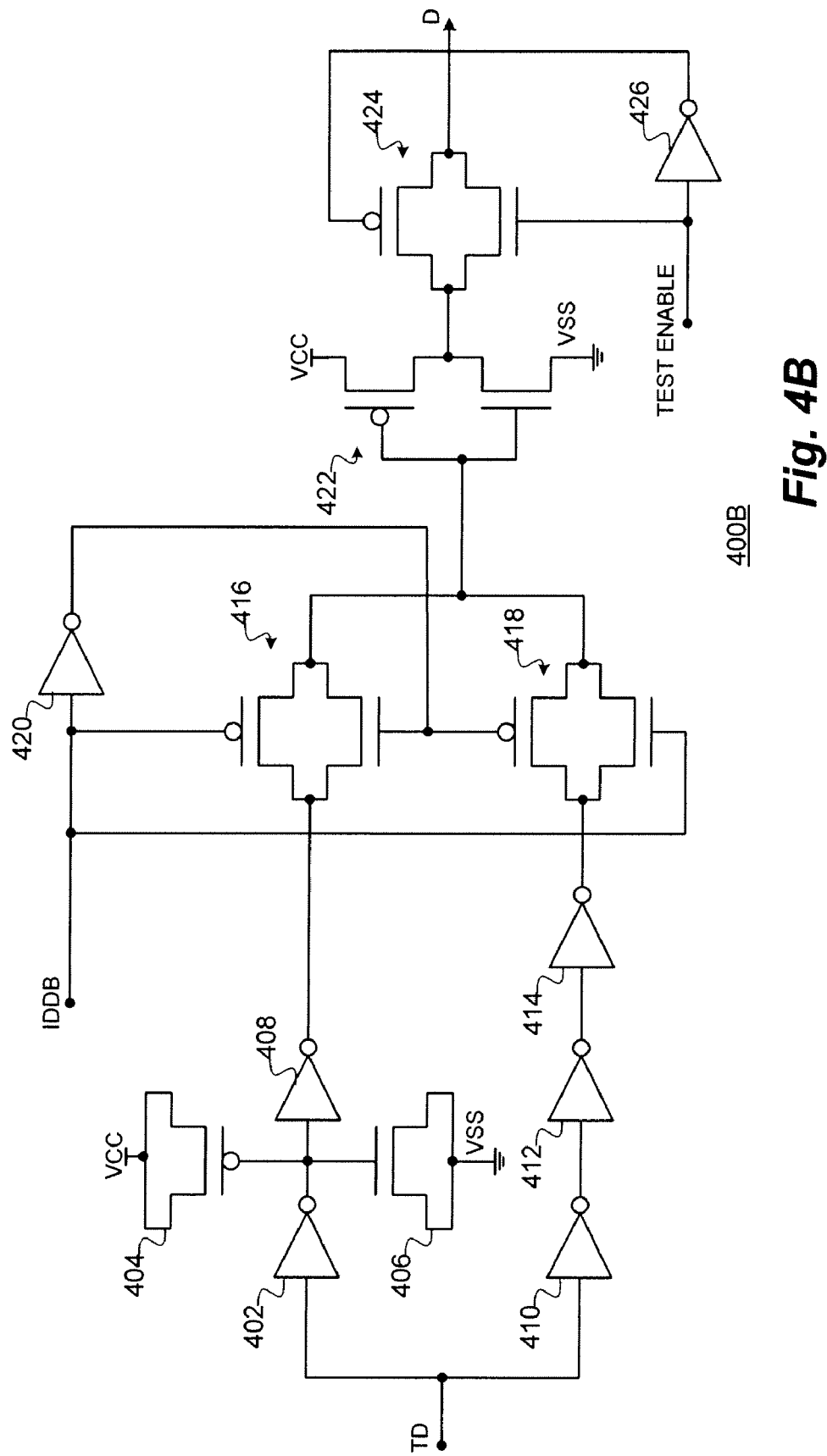
FIG. 4B is a detailed schematic illustration of another particular implementation of a test data input driver for possible use in conjunction with the representative testing configuration of FIG. 2.

With reference additionally now to FIG. 4B, a detailed schematic illustration of another particular implementation of a test data input driver 400B is shown for possible use in conjunction with the representative testing configuration 200 of FIG. 2. The test data input driver 400B, as discussed previously, receives data input at node TD which is coupled through an inverter 402 to another intermediate node having a capacitor coupled P-channel transistor 404 tied to a supply voltage source (VCC) and a corresponding capacitor coupled N-channel transistor 406 tied to a reference voltage source (circuit ground). This intermediate node is coupled through another inverter 408 to one input of a CMOS transmission gate 416.

Similarly, the data input on node TD is coupled through another string of series connected inverters 410, 412 and 414 to the input of a second CMOS transmission gate 418. An IDDB signal is supplied directly to the gate of the P-channel transistor of the transmission gate 416 as well as the gate of the N-channel transistor of the transmission gate 418. The IDDB signal is also inverted through an inverter 420 for application to the gate terminals of the N-channel transistor of transmission gate 416 and the P-channel transistor of transmission gate 418. The outputs of both transmission gates 416 and 418 are provided as input to a CMOS inverter 422 which has its output coupled to the input of an additional CMOS transmission gate 424. A TEST ENABLE signal is supplied to the gate of the N-channel transistor of the transmission gate 424 while an inverted signal through inverter 426 is supplied to the gate terminal of the P-channel transistor of the transmission gate 424. The data input (D) is taken at the output of the additional transmission gate 424.

In operation, the test data input driver 400B also performs a data inversion function in the data path when the IDDB input is at a logic "low" level. When the IDDB input is at a logic "high" level, the test data input driver 400B outputs Non Inverting Data when TEST ENABLE is "high" and when TEST ENABLE is "low" it places a high impedance (hi-Z) on the data output line (D) and allows the associated CPU or other circuitry (not shown) to drive the data.

Figure 5:
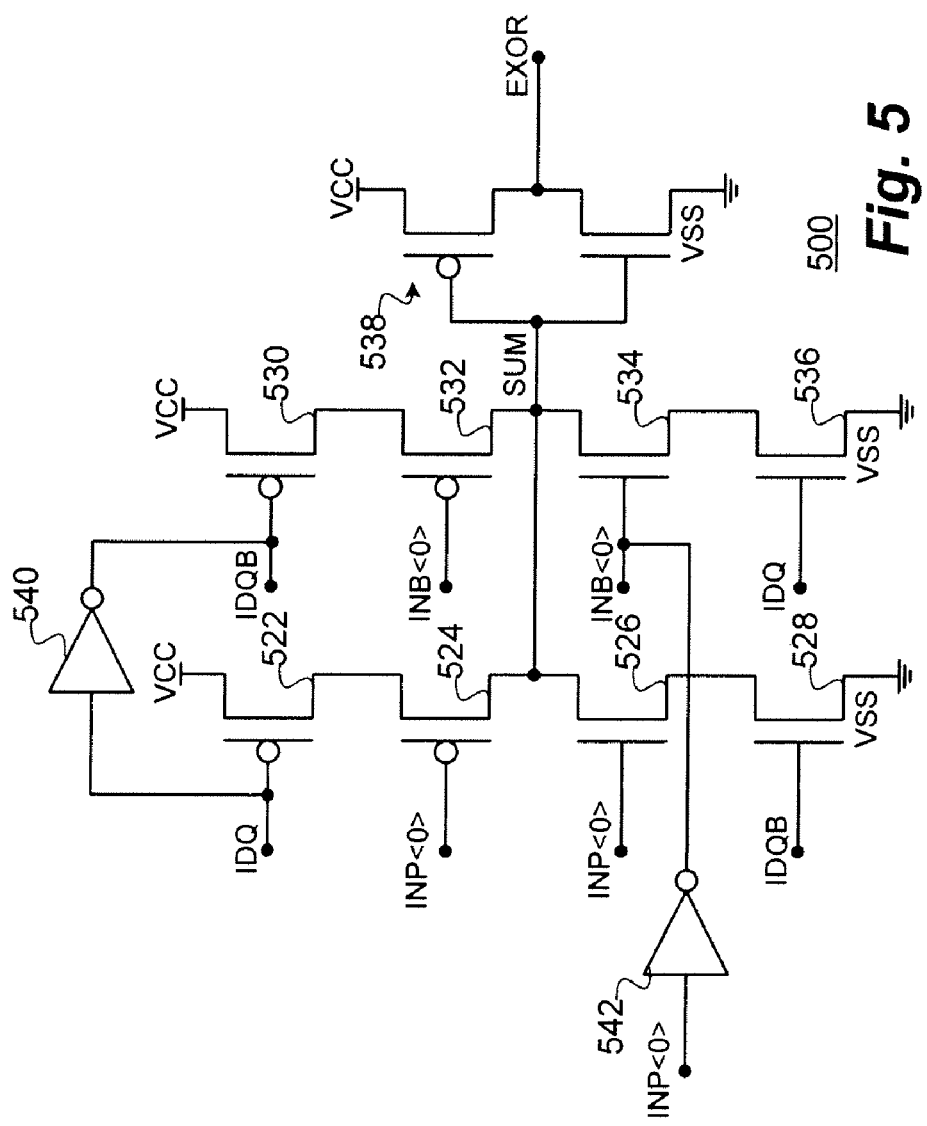
FIG. 5 is a schematic illustration of an exclusive OR (EXOR) circuit for possible use in conjunction with the technique of the present invention.

With reference additionally now to FIG. 5, a schematic illustration of an exclusive OR (EXOR) circuit 500 is shown. The EXOR circuit 500 comprises a first string of series connected P-channel transistors 522, 524 and N-channel transistors 526, 528 coupled between VCC and VSS as shown. The IDQ signal is supplied to the gate of transistor 522, the INP<0> signal is supplied to the gate of transistor 524 and the gate of transistor 526 and the IDQB signal is supplied to the gate of transistor 528.

The EXOR circuit 500 also comprises a second string of series connected P-channel transistors 530, 532 and N-channel transistors 534, 536 also coupled between VCC and VSS as shown. The IDQ signal is supplied to the gate of transistor 536, an INB<0> signal is supplied to the gates of transistors 532 and 534 while the IDQB signal is supplied to the gate of transistor 530. The outputs of the first and second strings taken at the drain terminals of transistors 524 and 532 (node "SUM") are coupled to the input of an inverter 538 comprising series connected P-channel and N-channel transistors coupled between VCC and VSS. Output of the inverter 538 supplies the EXOR output shown. Also as shown, an inverter 540 couples the gate of transistor 522 to the gate of transistor 530 while another inverter 542 couples the INP<0> signal to the gate of transistor 534.

Figure 6:
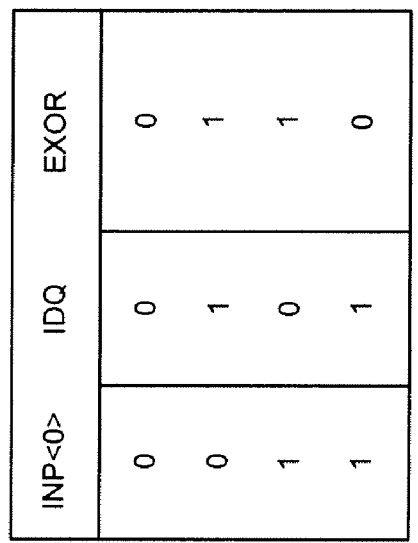
FIG. 6 is a truth table for the EXOR circuit of FIG. 5 showing the outputs thereof in response to states of the inputs thereto.

With reference additionally now to FIG. 6, a Truth Table is shown illustrative of the output signals at the output of the EXOR circuit 500 of the preceding figure in response to various states of the INP<0> and IDQ input signals thereto. Through the use of the EXOR function, the output of the EXOR circuit 500 is the same as the input INP<0> when IDQ is "low" and will be the inversion of INP<0> when IDQ is "high", thereby matching the written data.

Figure 7:
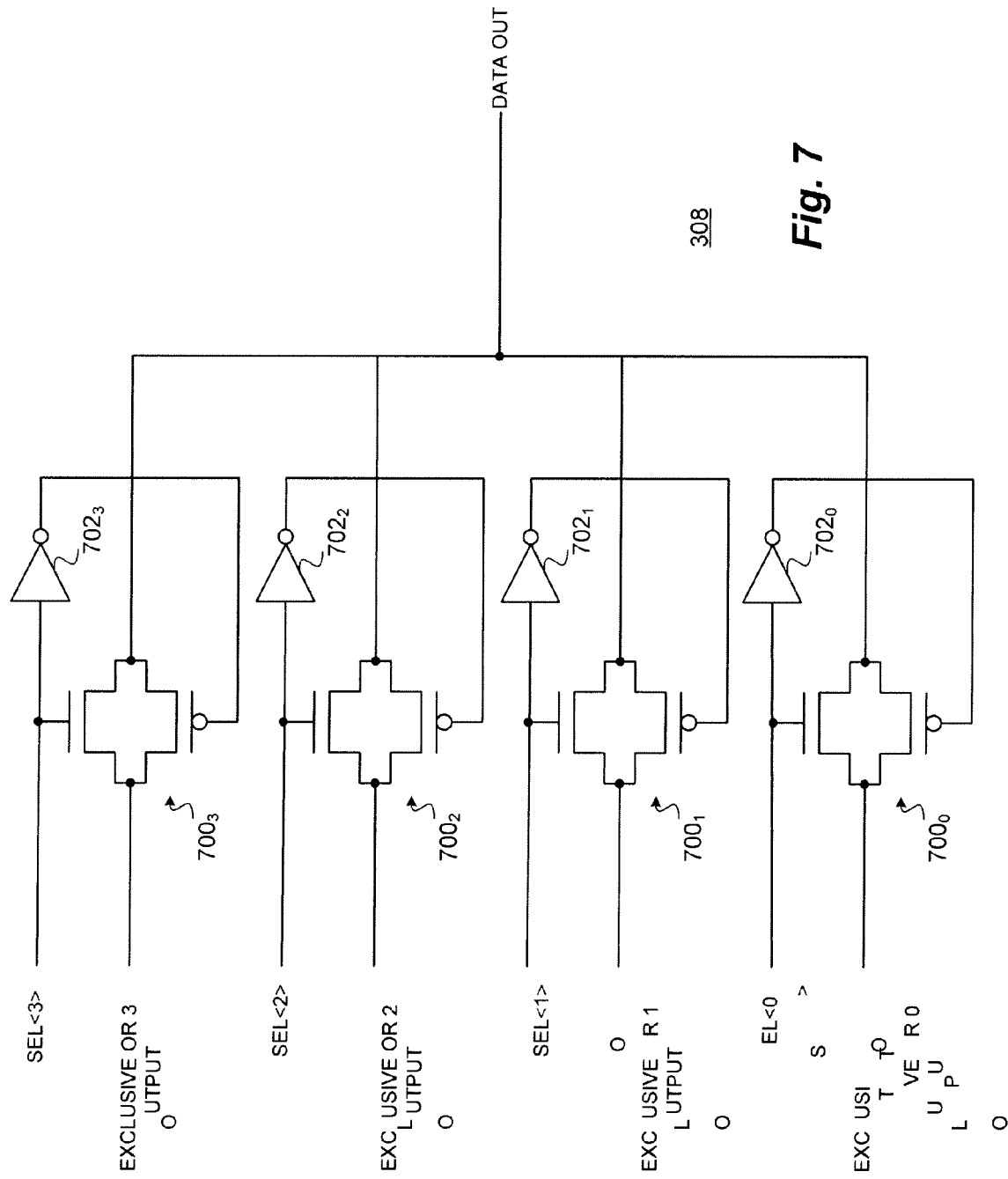
FIG. 7 is a more detailed schematic illustration of the 4:1 multiplexer of FIG. 3A.

With reference additionally now to FIG. 7, a more detailed illustration of the 4:1 multiplexer 308 of FIG. 3A is shown. In this representative embodiment, the multiplexer 308 comprises a number of CMOS transmission gates $700_0$ through $700_3$ which are respectively coupled to receive the outputs of the Exclusive OR circuits 500 labeled 0 through 3 in FIG. 3A. The outputs of the transmission gates $700_0$ through $700_3$ are all coupled to a common DATA OUT node as shown. Functionally, the transmission gates $700_0$ through $700_3$ are controlled by respective selection signals SEL<0> through SEL<3> (which are also input to the decoder 304 of FIG. 3A) which are applied directly to the N-channel transistors of each of the transmission gates $700_0$ through $700_3$ and inverted through respective inverters $702_0$ through $702_3$ to the P-channel transistors of each of the transmission gates $700_0$ through $700_3$.

While there have been described above the principles of the present invention in conjunction with specific circuit implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A testing technique for an integrated circuit device including a memory array, said technique comprising:
    determining a pattern of data inputs to be applied to said memory array;
    inverting selected ones of said pattern of data inputs;
    applying said pattern of data inputs including said inverted selected ones to said memory array;
    reading out a contents of said memory array;
    further inverting said previously inverted selected ones of said applied pattern from said read out contents; and
    comparing said applied pattern of data inputs with said read out contents.

2. The technique of claim 1 wherein said determining of said pattern of data inputs comprises:
    selecting a pattern of said data input intended to test an input/output portion of said integrated circuit device.

3. The technique of claim 2 wherein said selecting of said pattern comprises:
    utilizing data stripes in said selected pattern.

4. The technique of claim 1 wherein said determining of said pattern of data inputs comprises:
    selecting a pattern of said data input intended to test said memory array of said integrated circuit device.

5. The technique of claim 2 wherein said selecting of said pattern comprises:
    utilizing column stripes in said selected pattern.

6. The technique of claim 1 wherein a number of said data inputs is less than the width of said memory array data bus.

7. The technique of claim 6 wherein said number of said data inputs is one.

8. A testing technique for an integrated circuit device including a memory array, said technique comprising:
    dynamically providing a pattern of data inputs to be applied to said memory array;
    inverting selected ones of said pattern of data inputs;
    applying said pattern of data inputs including said inverted selected ones to said memory array;
    reading out a contents of said memory array;
    further inverting said previously inverted selected ones of said applied pattern from said read out contents; and
    comparing said applied pattern of data inputs with said read out contents.

9. The technique of claim 8 wherein said dynamically providing said pattern of data inputs comprises:
    selecting a pattern of said data input intended to test an input/output portion of said integrated circuit device.

10. The technique of claim 9 wherein said selecting of said pattern comprises:
    utilizing data stripes in said selected pattern.

11. The technique of claim 8 wherein said dynamically providing said pattern of data inputs comprises:
    selecting a pattern of said data input intended to test said memory array of said integrated circuit device.

12. The technique of claim 9 wherein said selecting of said pattern comprises:
    utilizing column stripes in said selected pattern.

13. The technique of claim 8 wherein said dynamically providing said pattern of data inputs is carried out by means of a programmable register.

14. The technique of claim 8 wherein a number of said data inputs is less than the width of said memory array data bus.

15. The technique of claim 14 wherein said number of said data inputs is one.

* * * * *